United States Patent [19]

Söderkvist

[11] Patent Number: 5,896,033
[45] Date of Patent: Apr. 20, 1999

[54] METHOD AND DEVICE FOR ELECTRONIC COMPENSATION OF ELECTRICAL DISTURBANCE SIGNALS AND USE THEREOF

[75] Inventor: Jan Söderkvist, Tä, Sweden

[73] Assignee: Colibri Pro Development AB, Taby, Sweden

[21] Appl. No.: 08/860,794
[22] PCT Filed: Jan. 4, 1996
[86] PCT No.: PCT/SE96/00002
  § 371 Date: Jul. 9, 1997
  § 102(e) Date: Jul. 9, 1997
[87] PCT Pub. No.: WO96/21842
  PCT Pub. Date: Jul. 18, 1996

[30] Foreign Application Priority Data

Jan. 13, 1995 [SE] Sweden .................. 9500113

[51] Int. Cl.$^6$ .................................................. G01B 7/16
[52] U.S. Cl. .................. 324/684; 324/720; 324/602; 73/769
[58] Field of Search ..................... 324/607, 650, 324/602, 684, 669, 720; 73/769

[56] References Cited

U.S. PATENT DOCUMENTS 3,073,973  1/1963  Rodewald .
4,288,741  9/1981  Dechene ..................... 324/650
4,346,311  8/1982  Aue et al. .
4,377,842  3/1983  Cambier .
4,481,464  11/1984  Noguchi ..................... 324/607
4,947,130  8/1990  Kitayoshi .................... 324/650
5,251,483  10/1993  Söderkvist .
5,347,870  9/1994  Dosch ........................ 73/769

FOREIGN PATENT DOCUMENTS 6-197294  7/1994  Japan .

Primary Examiner—Josie Ballato
Assistant Examiner—Jose M. Solis
Attorney, Agent, or Firm—Pollock, Vande Sande & Amernick

[57] ABSTRACT

The invention consists of a system to compensate for the parasitic signal induced by a parasitic impedance in the signal path. An auxiliary signal, outside of the frequency band of the desired signal, is introduced to evaluate the effects of the parasitic impedance. A compensating signal is then generated by simulating the effects of the parasitic impedance on the desired signal. Those simulated effects are then superimposed over the normal signal path with a phase adjusted to eliminate the effects of the parasitic impedance on the total resulting signal.

10 Claims, 5 Drawing Sheets

METHOD AND DEVICE FOR ELECTRONIC COMPENSATION OF ELECTRICAL DISTURBANCE SIGNALS AND USE THEREOF

TECHNICAL FIELD

The present invention relates to a method and device for the compensation of electrical disturbances caused by disturbing impedances, preferably capacitances, which method and device are suitable for applications in which high demands are placed upon the suppression of the disturbances, e.g. in a vibrating solid-state gyroscope, and are based upon measurement and compensation of disturbances caused by a superposed measuring signal of known characteristics.

PRIOR ART

It is known that electrical voltages and currents can disturb the environment in an undesirable manner. The undesirable energy leakage can very often be represented with stray impedances. Stray capacitances usually represent the disturbances well.

In a number of applications, it is sufficient to design the electronics and the environment well to minimize the values of the disturbing impedances. Higher suppression can be obtained by using a fixed compensation of the effect of the disturbances. This presupposes that the amplitude, phase and location of the disturbances are known or that their effect at least is measured.

Certain applications place very high demands upon the suppression of disturbances. For these applications, ageing and temperature variations can cause disturbing impedances to vary with time and temperature to an unacceptably high degree. The mutual strength of the signals which leak by way of the disturbing impedances and the components which are used for fixed compensation can also vary to an unacceptably high degree. For these applications, optimally designed geometry, electronics layout and fixed compensation are not sufficient.

In those applications in which it is essential for the effect of disturbing impedances to be minimized, an active compensation of the energy leakage should be used. An optimal suppression of the disturbances pre-supposes that their effect can be measured and compensated for on a continuous or virtually continuous basis. This can be realized, for example, by the electronics or mechanics periodically suppressing the normal signal. During this switching, the effect of the disturbing impedances can be measured. This information can then be used for a virtually continuous compensation.

Certain applications do not allow the strength of the normal signal to be altered periodically. Nor is it always possible to separate the abnormal disturbance signals from the normal signal. In these cases, measurement of the disturbance by means of switching cannot be used. There is therefore a need for an alternative method for the continuous, active compensation of disturbance signals caused by actual or represented stray impedances.

The proposed invention is intended to resolve the above-mentioned problems.

ACCOUNT OF THE INVENTION
TECHNICAL PROBLEM

There is a need to be able to measure and compensate for disturbances caused by disturbance impedances, e.g. stray capacitances, in an active and continuous manner. In certain applications, the disturbance signals cannot easily be separated from normal signals.

Examples of applications in which the solution described below for the suppression of disturbances can advantageously be used can be found, inter alia, in structures produced by micromechanics. A specific example is constituted by vibrating solid-state gyros, e.g. such as described in SE 8900666-2, in which two vibration modes whose amplitude differs by many powers of ten are used. The vibration having the larger amplitude is normally excited by electrostatic or piezoelectric means, at its mechanical resonance frequency, with a signal of the order of magnitude of about one or a few Volts. The amplitude of the lesser vibration provides a measure of the imposed rotation speed. A piezoelectric detection of this amplitude produces a signal in the order of magnitude of pA or nA where quartz is used as the piezoelectric material. The signal levels mean that even very small disturbing impedances produce an undesirably large disturbance signal superposed upon the detected signal. Since the disturbance signal can be expected to have a time-dependency and temperature-dependency, this means that a correct detection can only be realized if the disturbances are effectively, continuously and actively suppressed with respect to both amplitude and phase.

SOLUTION

The principal object of the present invention is to propose a method and device for the measurement and compensation of disturbance signals, which permit a solution to the problems specified above. That which may primarily be considered to be characteristic of the novel device can be seen from the defining clause of claim 1 which follows.

The novel compensation system is based upon the fact that one or more signals of known characteristics, e.g. of specific frequencies, are superposed before the points from which the disturbance originates. By measuring the amplitude and the phase of the disturbances caused by the added measuring signals, information is obtained concerning the size of the disturbing impedances. The measurement is expediently effected using synchronous demodulation, multipliers or some other known technique which permits extraction of the leakage both in phase (resistive leakage) and out of phase (capacitive and inductive leakage), using the superposed measuring signal. A subsequent rectification produces a DC-signal, the size of which constitutes a measure of the size of the leakage, i.e. of the size of the disturbance impedances.

By a suitable choice of the superposed measuring signals, these leak in similar fashion to the normal signals. By measuring the leakage of the measuring signals, information is also therefore obtained concerning the leakage of the normal signals.

The information on the way in which the superposed measuring signals cause disturbance can be used to compensate, e.g. eliminate, the effect of the disturbing impedances for the superposed measuring signals and hence also for the normal signals. The compensation can be realized, for example, by the adjustment of amplitudes, phases or amplifications by way of traditional circuit designs, e.g. using voltage-controlled amplifiers. By including the measurement and compensation in an active control loop, a continuous compensation can be obtained, which has no effect upon the normal behaviour of the system.

Through knowledge of the nature of the disturbing impedances—capacitances, inductances or resistances—a decision is taken as to whether one or more measuring signals will be used in this process. Where leakage results only from stray capacitances, for example, a superposed measuring signal will suffice, the frequency of which is similar to the normal signal. In order to prevent the proposed compensation system from affecting the system in which it is used, it is important that the frequency of the added measuring signals should not coincide with or lie close to an odd multiple of any one of the characteristic electrical or, for certain systems, mechanical frequencies of the system.

The proposed compensation system offers good prospects of suppressing disturbing impedances, e.g. stray capacitances, present in an existing system. The compensation system can be included in existing circuit designs without ordinary signal paths being affected, provided that the normal system has frequency gaps within which the frequency of the superposed measuring signals can be chosen.

The sources of error of the compensation system are limited to how well the disturbance caused by the superposed measuring signals can be measured. To this should be added that the compensation system has a latent, in-built source of error through the fact that the disturbances cannot be measured exactly at the frequencies which are normally used by the system. This latter error has experimentally been shown to be reducible to a small size in relation to instances in which only a passive compensation is used.

ADVANTAGES

In addition to the fact that the above-stated problems are resolved, the compensation system per se can be very workable and stable by virtue of the fact that it can be used for a number of different applications and can be designed to withstand, inter alia, high environmental stresses and large variations in disturbances. A summary of some other advantages lists that the proposed compensation system . . .

- can be used continuously without the normal signal needing to be "shut off".
- can be easily included in an existing circuit design without major modifications.
- is suitable for compensation of various types of stray impedances.
- that the variation in stray impedances can be tracked by the size of the compensation signals.
- does not require external reference signals or reference units.
- correctly encapsulated, can be used in any environment whatsoever.
- is electronic without moving parts which wear.
- is simple and cheap to use.

BRIEF DESCRIPTION OF THE DRAWINGS

A presently proposed embodiment exhibiting the characteristics which are indicative of the invention will be described below, with simultaneous reference to the appended drawings in which.

PREFERRED EMBODIMENTS

Figure 1A:
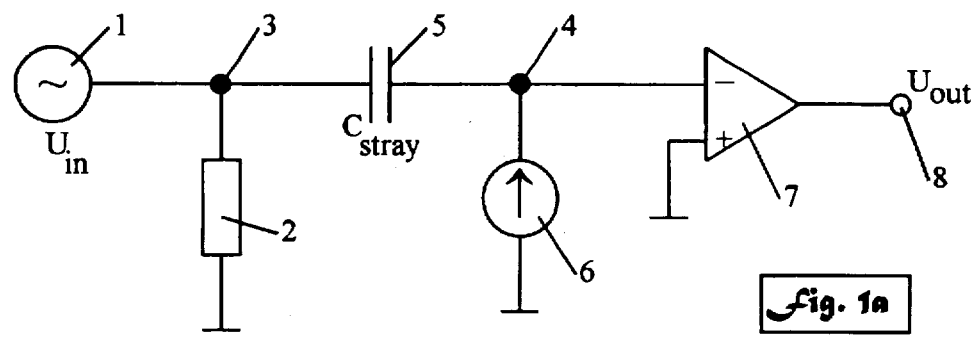
FIG. 1a shows the principle of a system having a stray capacitance.

FIG. 1a shows an example of how a disturbing impedance in the form of a stray capacitance affects an electronic circuit. The signal source 1, which represents a voltage somewhere in the circuit, is subjected to an equivalent load 2. The disturbance source 3 to which the voltage source gives rise generates disturbances in the environment, e.g. at the point 4. The disturbances can normally be represented by impedances between the disturbance source and the disturbed point. The disturbance is usually capacitive, which is illustrated in FIG. 1a by means of the stray capacitance 5. The current generated by the capacitive disturbance is added to the current, represented by the current source 6, which normally flows through the disturbed point 4. Using a subsequent current-voltage converter 7, the current is convertible into a voltage 8, which constitutes a measure of the normal signal with the disturbing measuring signal superposed.

Figure 1B:
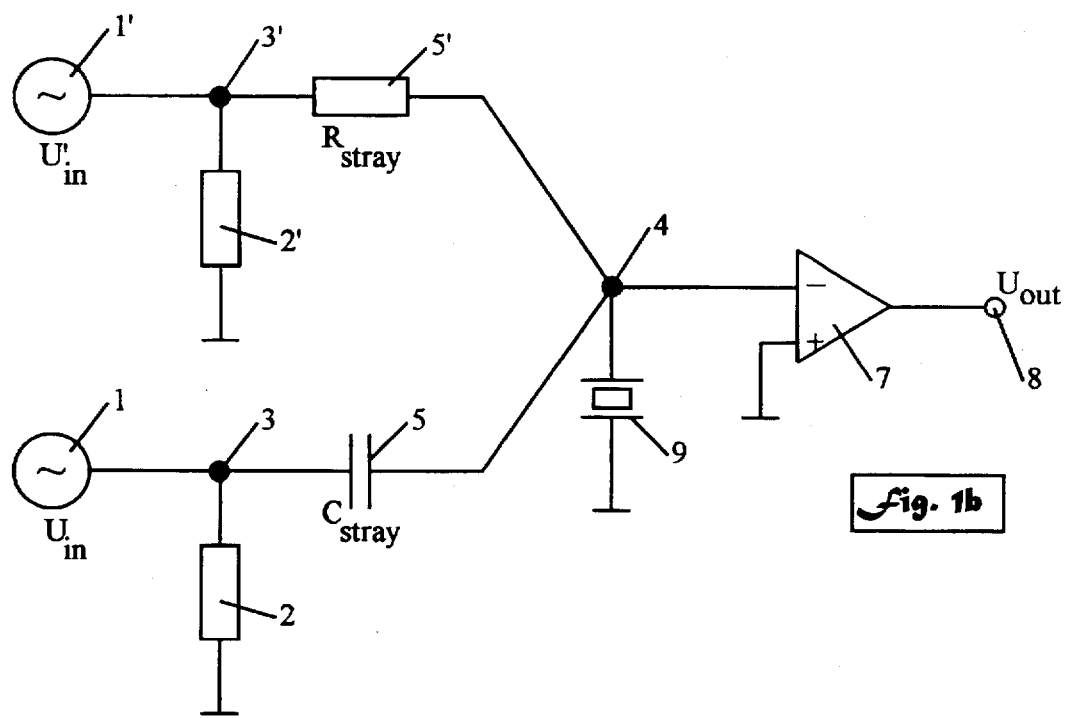
FIG. 1b shows the principle of a piezoelectric system having two different stray impedances and disturbance sources.

Normally, disturbing impedances exist between each pair of points in an electronics system. In most cases, only a small minority of the disturbances are of such order of magnitude that they require attention. FIG. 1b shows an example having more than one disturbing impedance. In this circuit, two signal sources 1 and 1' create, with the equivalent loads 2 and 2', two disturbance sources 3 and 3'. The figure shows the possibility of different types of disturbing impedances 5 (stray capacitance) and 5' (leak resistance) between the disturbance sources and the disturbed point. In FIG. 1b, the normal current to the disturbed point 4 has been assumed to come from a piezoelectric sensor 9. Consideration should naturally be given to how FIGS. 1a and 1b are to be modified to include more than two disturbance sources and disturbing impedances and more than one disturbed point and how the representation is to be applied to specific circuit designs.

If the voltage of the signal source is high and the normal current generated by the current generator is small, high-impedive disturbing impedances will also generate notable disturbances. To quote an example: a voltage of 1 Volt generates a disturbing current of 19 nA at 30 kHz where the stray capacitance is 0.1 pF. This must be compared to the solid-state gyro quoted as an example above, whose detectable piezoelectric current is in the order of magnitude of pA and nA. This numerical example points to the existence of applications in which there is a necessity to use means for compensating the effect of the disturbing impedances.

Figure 2A:
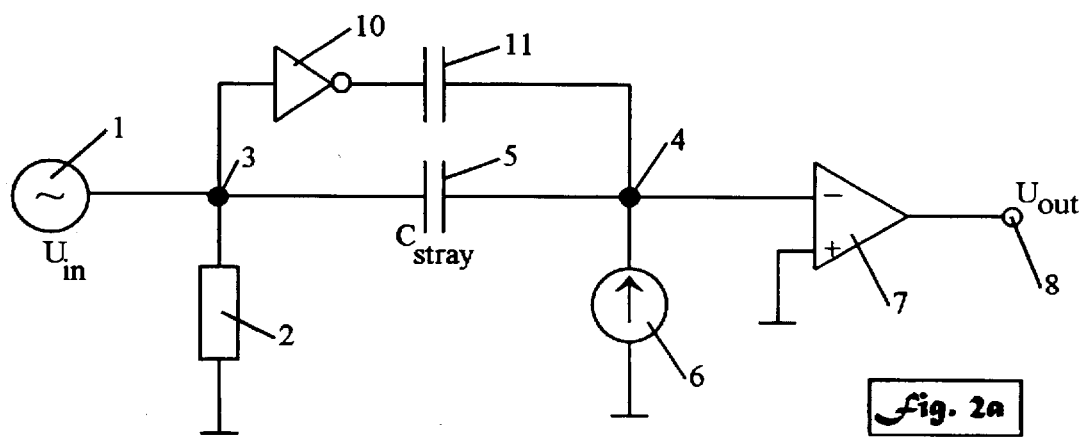
FIG. 2a shows the principle of a system having a stray capacitance and a passive compensation parallel to the stray capacitance.
Figure 2B:
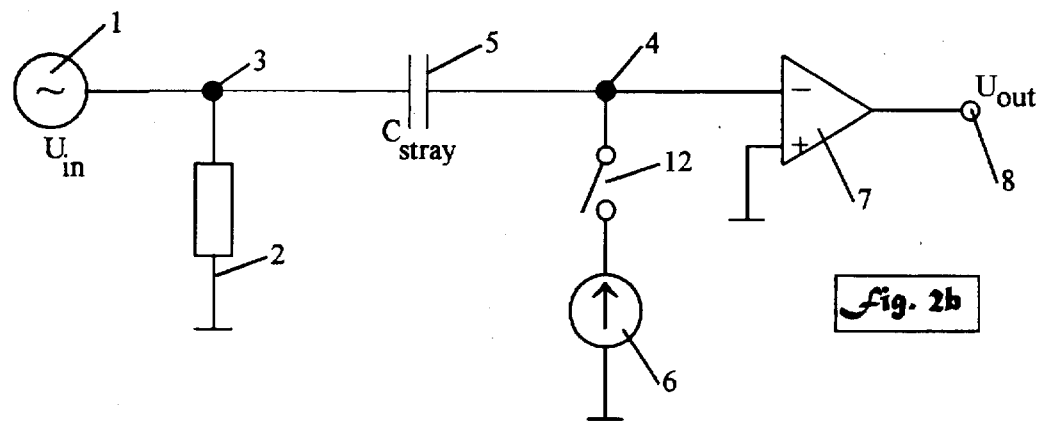
FIG. 2b shows the principle of a system having a stray capacitance, in which the compensation is realized by means of switching.

FIGS. 2a and 2b show two known alternative methods for compensating for the existence of the disturbing impedances. In FIG. 2a, a signal path, including an inverting amplifier 10 and a capacitance 11, has been added parallel to the disturbance. By choosing the amplification at 10 and the size of 11 correctly, the current through the parallel branch can be made to eliminate totally the current through the disturbing impedance. In this case, the voltage 8 will constitute a direct measure of the normal signal. The phase in the compensating branch will be adjusted on the basis of the type of disturbing impedance. This can be realized, for example, by the choice of compensation impedance 11. This impedance does not need to be constituted by an actual impedance, but can be constituted by a stray impedance of the same type as the disturbing impedance 5. Alternatively, a compensating branch with a different phase can additionally be placed parallel to the signal path represented by 10 and 11. In a number of applications, it is sufficient to make a once-and-for-all adjustment of the amplification at 10, i.e. to use a fixed and passive compensation.

In FIG. 2b, switching is used to measure the size of the disturbance. This method presupposes that the normal signal, alternatively the disturbances, can periodically be shut off. In the figure, it is assumed that the normal signal path is periodically shut off by use of the switch 12. When the switch is open, the voltage at point 8 depends only upon the disturbance 5, whereas it depends both upon the normal signal 6 and upon the disturbance 5 when the switch is closed. By subtracting these two signal values, a virtually continuous compensation for the effect of the disturbing impedances can be achieved.

The numerical example which has been quoted above shows an example in which a fixed passive compensation according to FIG. 2a is insufficient. Minor variations in the disturbing impedances or in the relative voltages of the disturbance sources produce unacceptably large disturbances as a function of temperature and ageing. In this example, neither is it feasible to use switching, since time constants and low signal strength of the sensor system result in an undesirable deterioration in performance in response to switching. This example points to the existence of applications in which major importance is attached to active, continuous compensation in which the normal signal path is not affected.

Figure 3:
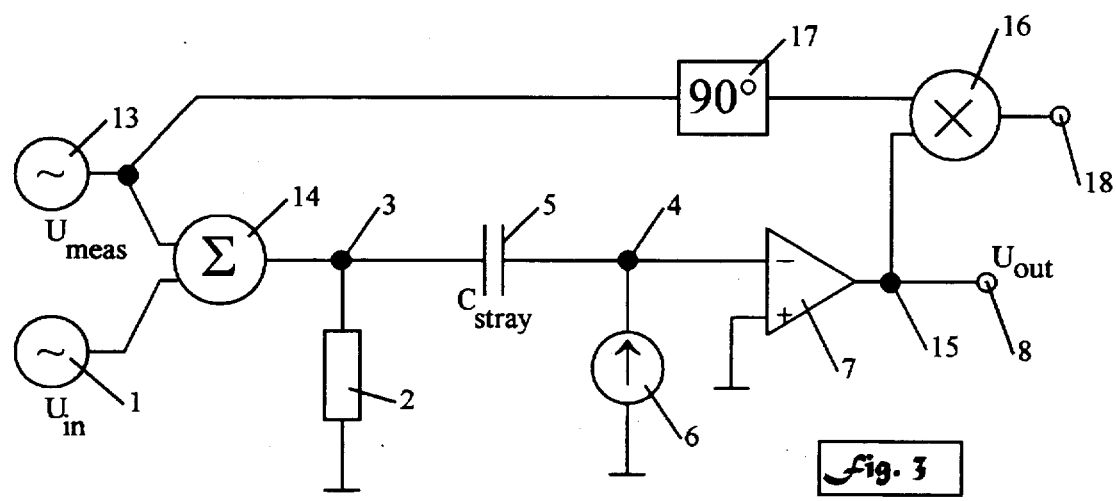
FIG. 3 shows the principle of a system having a stray capacitance, in which a measuring signal has been superposed before the disturbance source.

FIG. 3 shows the basic structure of the proposed invention. A measuring signal of known characteristics 13 is superposed onto the signal from the normal signal sources of the system. An optimal effect is obtained if the superposition takes place before the signal reaches the region within which the dominant disturbing impedances are found and if the normal signal path is unaffected. By way of example, addition is used in the superposition 14. The added measuring signal is affected by the disturbing impedances in similar fashion to the normal signal. This means that, where disturbing impedances exist, there are traces of the measuring signal in the point 15. The size of the disturbing impedances can thus be measured by measuring the measuring-signal content in the point 15. This is realized, for example, using synchronous demodulation, multipliers 16 or some other known method for measuring amplitude for a given phase of an AC-signal (hereinafter referred to as demodulation). In the demodulation, the superposed measuring signal 13 is compared to the disturbed signal 15. Where some disturbing impedance is capacitive or inductive, it is necessary to change the relative phase between the signals which are compared in the demodulator 16, for example by 90°. In FIG. 3, the superposed measuring signal has been phase-shifted (17). The DC-component present in the resultant signal 18 from the demodulator 16 constitutes a measure of the size of the disturbing impedances. Where the normal signal at the point 15 does not have any DC-component, the superposed signal can be constituted by a DC-signal. The extraction of the information concerning the disturbing impedances can then be realized by direct measurement of the DC-component in the point 15.

Figure 4A:
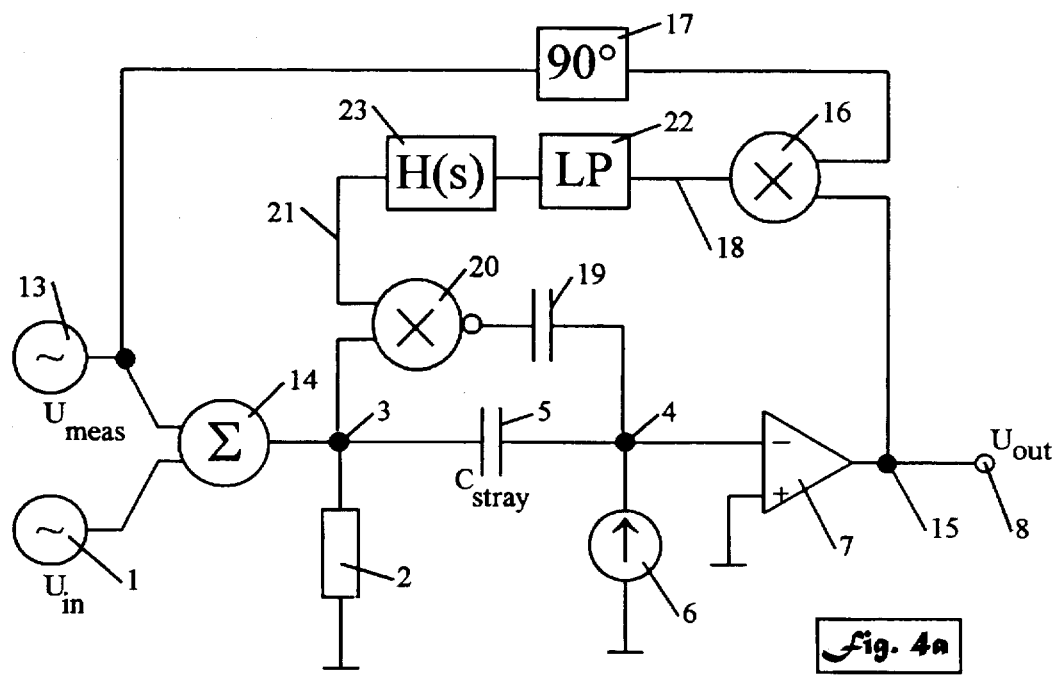
FIG. 4a shows the principle of a system having a stray capacitance, offering a facility for active compensation of the stray capacitance.
Figure 4B:
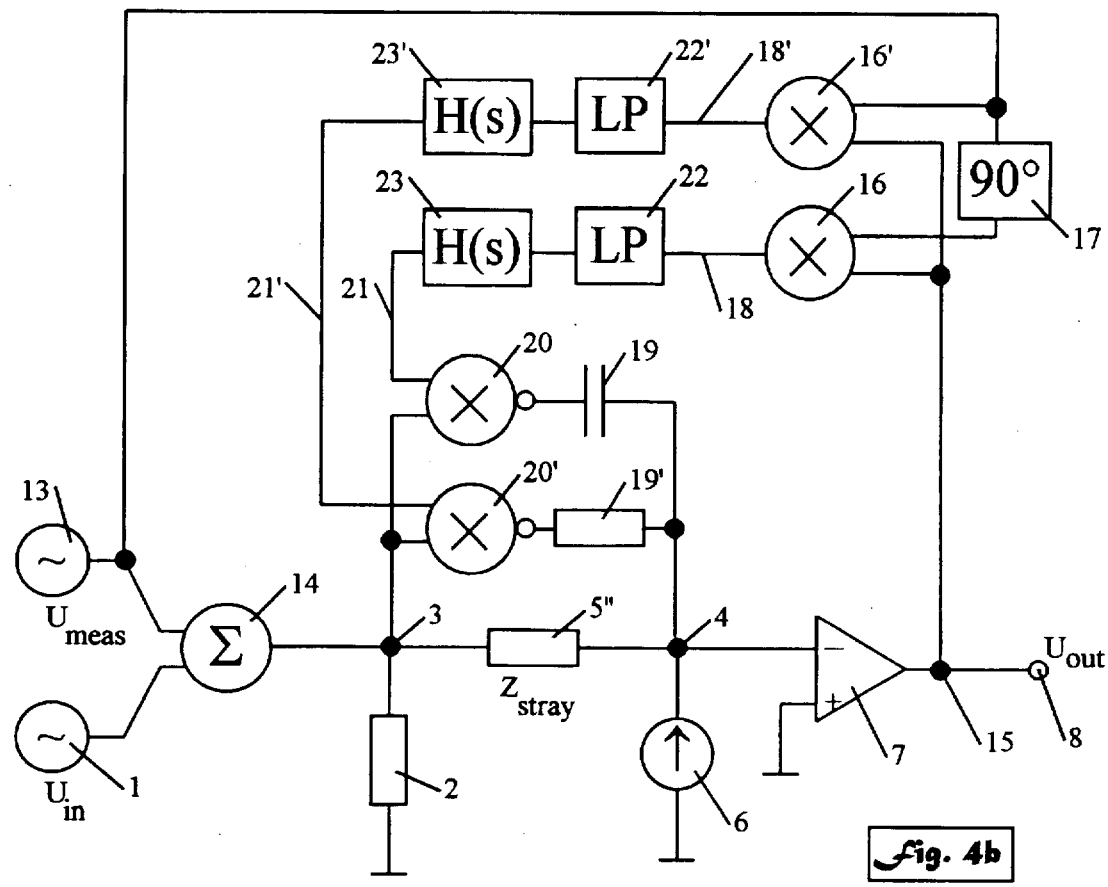
FIG. 4b shows the principle of a system having a stray impedance, offering a facility for active compensation of two phase components.
Figure 4C:
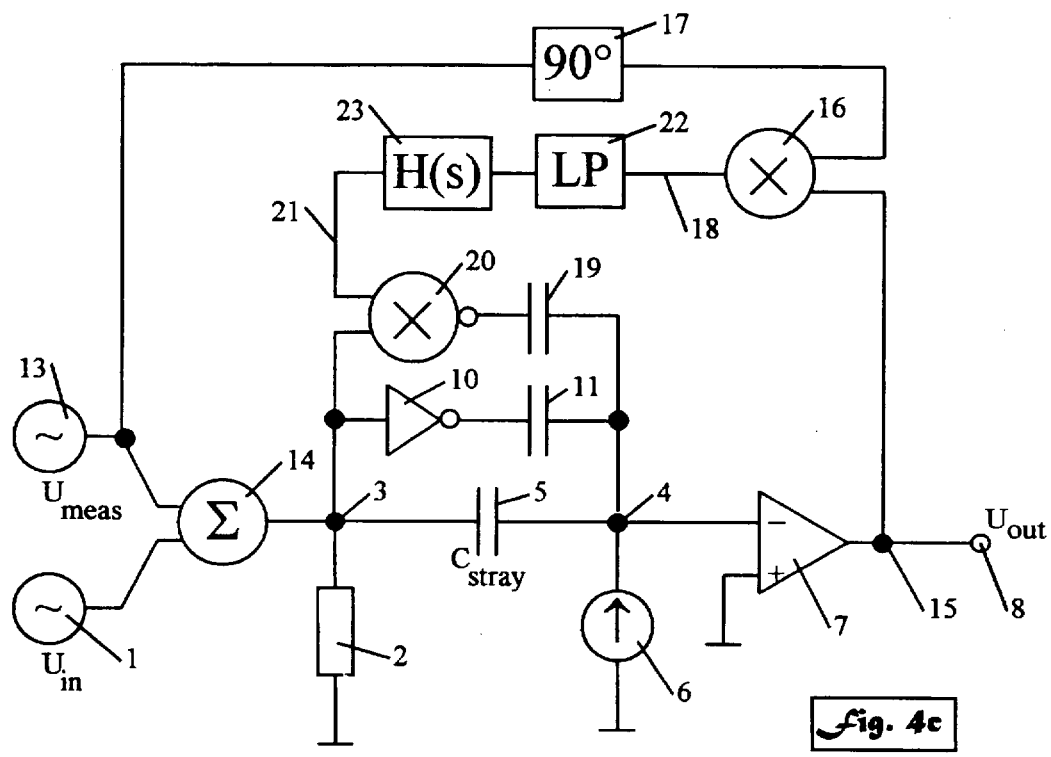
FIG. 4c shows the principle of a system having a stray capacitance, in which an active compensation has been supplemented by a passive compensation.

The information, acquired in FIG. 3, concerning the size 18 of the disturbing impedances can be used to control their compensation. FIGS. 4a, 4b and 4c show three methods for a compensation based upon parallel signal paths. In FIGS. 4a and 4c, a stray capacitance 5 and in FIG. 4b a general stray impedance 5" has been assumed. In FIG. 4a, the compensation is realized by means of a parallel signal path containing a capacitance 19 and a variable amplifier 20. The amplifier can be constituted, for example, by a voltage-controlled amplifier in the form of a multiplier. By varying the (DC) signal 21, which controls the amplifier 20, suitable compensation can be obtained, for example with a view to the output signal 15 having no trace of the superposed measuring signal, i.e. with a view to the signal, at the point 18, having no DC-component. In order to obtain an active compensation, the output signal 18 of the demodulator is connected by means of a low-pass filter 22 and control filter 23 to the control signal 21 for the compensation. The setting of the control parameters at the control filter governs the characteristics of the active compensation, e.g. the time constant. A simple variant of a control filter includes an integrator and an amplifier.

In FIG. 4b, two parallel compensating signal paths have been used to permit compensation of two phase components of the unknown disturbing impedance 5". In order to achieve this dual compensation, two phase components of the output signal 15 would have to be measured by means of the demodulators 16 and 16'. At least one of the input signals to the demodulators would therefore have to be phased-shifted (17), for example by 90°. The DC-components of the output signals 18 and 18' of the demodulators constitute measures of how much of the superposed measuring signal is present in the point 15. In FIG. 4b, the two compensation branches contain the capacitance 19 and the resistance 19', as well as the amplifiers 20 and 20', which are controlled by the (DC) signals 21 and 21'. These control signals are obtained from the output signals of the demodulators using low-pass filtering (22 and 22') and control filtering (23 and 23'). In FIG. 4b, two compensating signal paths are used, which are phase-shifted relative to each other (cartesian compensation). The same effect is achieved where, in addition to the amplitude, adjustment is also made to the phase of a compensating signal path (polar compensation).

In FIG. 4c, the active compensation in FIG. 4a has been supplemented by a passive compensation comprising the capacitor 11 and the fixed amplifier 10. A fixed compensation relieves the active compensation, which normally increases the accuracy and reduces the noise. In FIGS. 4a, 4b and 4c, the compensation signal has been added in the disturbing point 4. This addition can also be made at a later stage of the (detection) electronics.

Figure 5A:
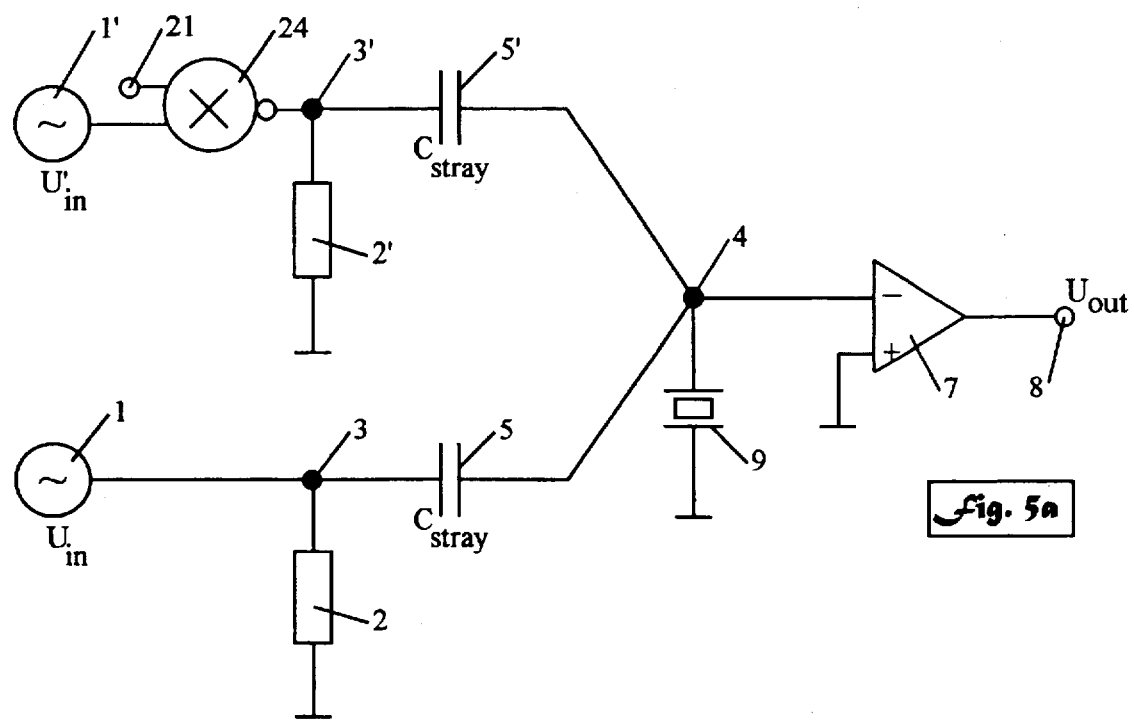
FIG. 5a shows the principle of a system having two stray capacitances and two disturbance sources, in which the compensation is realized by complementary activation.
Figure 5B:
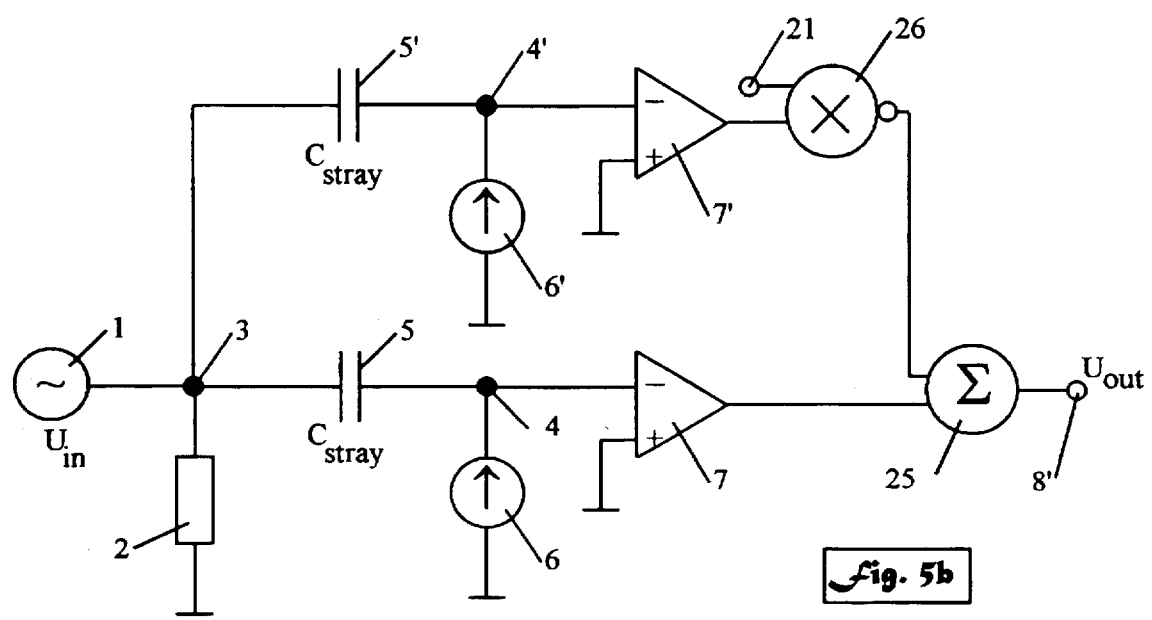
FIG. 5b shows the principle of a system having two stray capacitances and a disturbance source, in which the compensation is realized by complementary detection.

FIGS. 5a and 5b show two alternative couplings for achieving compensation. The circuit designs in these figures contain only those details which relate to the compensation itself. Consideration should naturally be given to how they should be supplemented to ensure that the measurement of the size of the disturbing impedances will be able to be achieved. In FIG. 5a, complementary activation for the compensation for a system having a plurality of disturbance sources is used. By varying the relative signal strength of one or more disturbance sources by means of variable amplifiers 24, the disturbing effect caused by the disturbing impedances can be made to cancel each other out. This method normally presupposes that the disturbance sources have different polarity. This is not however necessary where the disturbing impedances comprise both inductances and capacitances. Where active compensation of a plurality of phase components is presupposed, complementary activation can be used where either disturbance sources of different phase position are obtainable or where additional disturbance sources with suitable phase position are created for the compensation (compare FIG. 4b). Otherwise, compensation cannot be realized with only marginal effect upon the normal signal path.

In FIG. 5b, complementary detection is used for the compensation in a system having a plurality of disturbed points 4 and 4'. By superposing the output signals from 7 and 7', for example by use of summation 25, with suitable alteration of the amplification 26, a compensation of the effect of the disturbing impedances is obtained. Where active compensation of a plurality of phase components is required, complementary detection can be realized by phase-adjustment of the amplifier 26. Complementary detection very often affects the normal signal and is expediently used only when the effect upon the normal signal of the superposition in 25 is marginal. FIGS. 5a and 5b can also, of course, be supplemented by fixed compensation according to FIG. 4c.

The above-described has principally been illustrated with reference to one disturbance source. For anybody who is versed in the technique, it is assumed to be clear how to proceed to the expansion to a plurality of disturbance sources and disturbing impedances. By appropriate choice of the number of superposed measuring signals and their frequencies, the characteristics of the disturbing impedances can be well characterized. By superposing measuring signals of different frequency at different places, it is possible to determine the location of the disturbing impedances. It should also of course be borne in mind that the compensation can be realized at a number of points and in a number of stages.

The information concerning the size of the disturbing impedances is obtained at that frequency/those frequencies which is/are used by the superposed measuring signals. Where the disturbing impedances are only of one type, for example (stray) capacitances, the use of superposed measuring signals of one frequency is sufficient to achieve effective compensation. Where different types of disturbing impedances have to be taken into account, measuring signals of different frequency may need to be used.

Where the system normally contains signals of only one frequency $f_0$, the compensation is best realized according to the above description where the relative difference between $f_0$ and the frequency $f_{meas}$ of the superposed measuring signal is small, from experience less than 20%. This guarantees that the setting of the compensation, which is based on $f_{meas}$, shall also be valid at $f_0$. A small relative frequency difference is especially crucial where several types of disturbing impedances are of importance. Unless the relative frequency difference can be kept small, and where several types of disturbing impedances are of importance, a plurality of superposed signals of different frequency should be used. Where only one type of disturbing impedance exists, $f_{meas}$ can in certain isolated cases advantageously be chosen at an even multiple of $f_0$. The advantage is that the filtering of the demodulated signals then very effectively suppresses the normal frequency $f_0$ of the system.

Where the system normally contains signals of a plurality of frequencies, $f_0^{(k)}$, k=1,2, . . . , whose relative difference is not small, the compensation according to the above description is best realized where a plurality of superposed signals of different frequency are used, especially where different types of disturbing impedances are of importance in the frequency interval which is spanned by $f_0^{(k)}$. Expediently, the frequencies of the superposed signals, $f_{meas}^{(j)}$, j=1,2, . . . , are chosen such that for each of the most important frequencies amongst $f_0^{(k)}$ there is at least one superposed signal for which the relative frequency difference between $f_{meas}^{(j)}$ and $f_0^{(k)}$ is small.

Certain frequency intervals are expediently avoided for the superposed measuring signal. These are constituted by the frequencies in the direct vicinity of odd multiples of $f_0^{(k)}$. Where $f_{meas}^{(j)}$ lies in these intervals, the demodulators will react also to the useful signal. The width of the unsuitable frequency interval around $f_0^{(k)}$ is governed by the band width, and hence the time constant, of the low-pass 22 and 22' and control filter filtering 23 and 23'. A standard rule of thumb is that the width of the inadmissible intervals should be constituted by a low multiple of the band width of these filters. For certain electrically activated mechanical systems, neither should $f_{meas}^{(j)}$ be chosen closer to the mechanical resonance frequencies than a low multiple of the 3 dB-width of the mechanical resonance peaks.

It is expedient, but not essential, for the superposed measuring signal to have the same characteristics as the normal frequencies of the system, for example as regards the temperature coefficient belonging to the frequency. A compensation which is highly stable with respect to temperature and ageing is thereby obtained. For a crystal-based (or LC-based) system, this is achieved especially where the superposed signal is generated by an equivalent type of crystal (or LC-oscillator). If the signals have very different characteristics, problems may arise in trying to avoid the above-described inadmissible frequency intervals when the temperature varies and when the system ages.

Where only one superposed measuring signal 13 is used, the control signals 21 and 21' of the compensation are calculated directly from the output signals from the demodulators 16 and 16'. When a plurality of superposed measuring signals are used, the control signals of the compensation are calculated by weighing up the information from the demodulators measuring the leakage of the superposed measuring signals. This weighing-up procedure means that the number of superposed measuring signals does not need to coincide with the number of correction branches (19–20 and 19'–20' in FIG. 4b).

The vibrating solid-state gyro which is mentioned in the introductory description of the technical problem constitutes an example in which the compensation system which is here proposed can advantageously be used to compensate disturbing impedances between the higher voltages used in activation of the larger amplitude and the small detection currents from the smaller amplitude. The compensation system can there be included without the normal signals of the system being affected by the compensation. For the vibrating solid-state gyro, the compensation system offers a necessary reduction and stabilization of the zero-signal, which produces an improved temperature-stability and long-term stability. Where the sensor element for the vibrating solid-state gyro is constituted by a quartz crystal of the tuning-fork type, with resonance frequency in the frequency range 27–41 kHz, the superposed signal is generated, according to this proposal, with a clock crystal as the frequency-determining element (32.8 kHz). Clock crystals are cheap and have a fast start time.

Figure 6A:
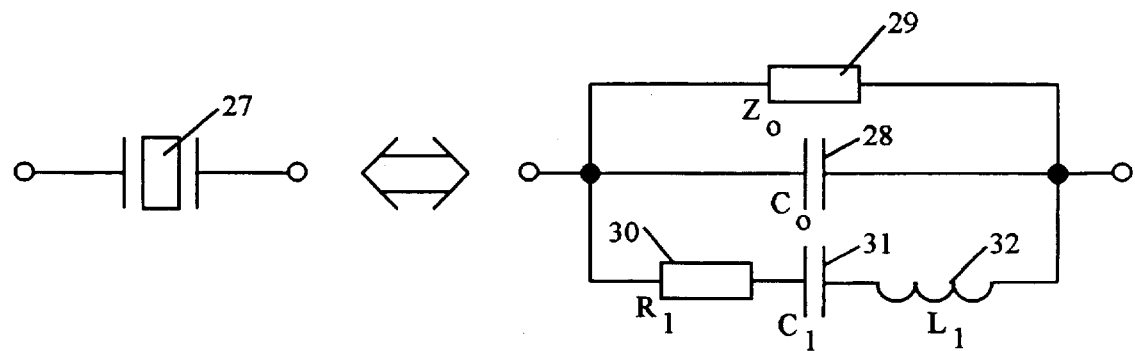
FIG. 6a shows the equivalence circuit for a piezoelectric crystal.

FIG. 6a shows an alternative application for the proposed compensation system. For piezoelectrically activated quartz resonators 27, mechanical resonance frequencies define the frequencies at which the crystal is used. At these frequencies, the phase belonging to the impedance of the crystal has a strong frequency-dependency, which is used to localize the resonance frequencies. Sharpest resonance is achieved where the dielectric capacitance 28 and other disturbing impedances 29 can be disregarded by comparison with that part of the electrical equivalence circuit which describes the mechanical vibration, 28–30. For example: unless $C_0$ is negligible in relation to $QC_1$, in which $1/Q$ constitutes a measure of the energy losses of the resonator, localization of the resonance frequency is made more difficult by a reduction in the phase variations close to the resonance frequency. Moreover, a difference arises between the electrically measurable and the mechanical resonance frequency. An active compensation of $C_0$ and $Z_0$ guarantees that the phase condition is fulfilled with respect to resonance, irrespective of temperature and ageing.

Figure 6B:
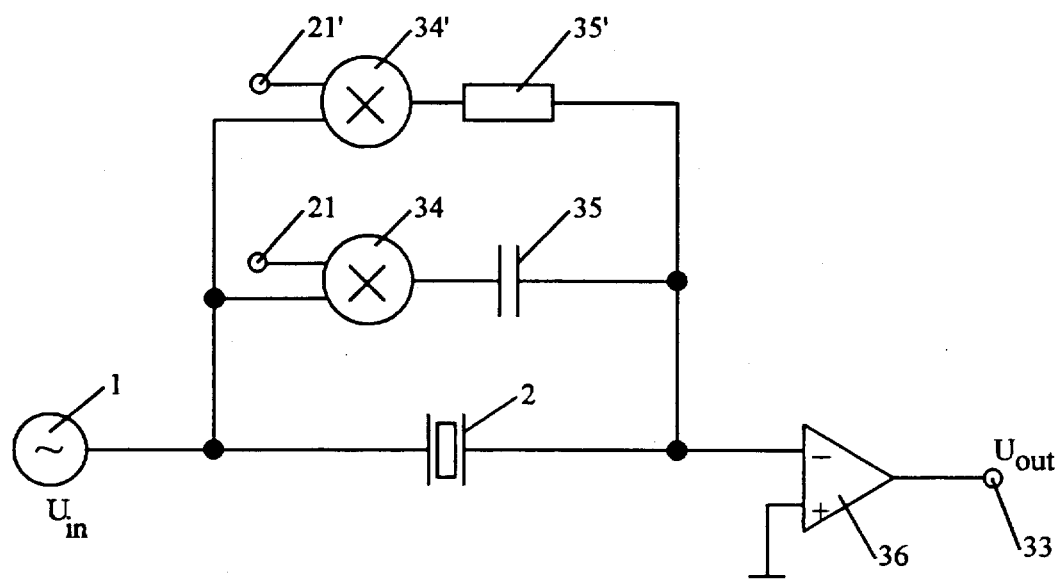
FIG. 6b shows the principle of compensation of the dielectric and resistive parts of the equivalence circuit of a piezoelectric crystal.

FIG. 6b shows an example of a circuit design for the details relating to the actual compensation of $C_0$ and $Z_0$ in FIG. 6a. Consideration should of course be given to how the circuit design should be supplemented by the superposition of a measuring signal to permit detection of its contribution to the output signal 33 and the production of control signals for the amplifiers in the compensation branches. Where the frequency of the superposed measuring signal does not coincide with some mechanical resonance frequency, the current through the mechanical equivalence branch 30–32 of the crystal can be neglected. The contribution of the superposed measuring signal to the output signal 33 is therefore constituted only by the currents through $C_0$, $Z_0$ and the compensating branches 34–35 and 34'–35', summated by the current-voltage converter 36. By adjusting the amplifications belonging to 34 and 34', so does not containing 33 does not contain any contribution from the superposed measuring signal, an active compensation of $C_0$ and $Z_0$ also with respect to resonance is therefore achieved.

The invention is not limited to the embodiment shown by way of example above, but can be subject to modifications within the scope of the following patent claims and the inventive concept.

I claim:

1. A method for compensating disturbance signals produced in a signal processing system from a leakage impedance connected to a point in which said signal processing system receives an input signal comprising:

superimposing a measurement signal at said point which has a frequency which does not interfere with the processing of said input signal;

comparing the magnitude of said measurement signal produced at an output of said signal processing system with the measurement signal introduced at said point whereby a value of said leakage impedance may be ascertained; and actively compensating said leakage impedance by inserting a compensating impedance in a path of said leakage impedance of said signal processing system based on said ascertained leakage impedance value which reduces said measurement signal produced at said output of said signal processing system.

2. Method according to claim 1 wherein the supplied measuring signal has well-defined frequencies which differ from dominant frequencies in the system by less than 20%, and in that the detection of the superimposed measuring signals is realized by means of phase detecting signals produced from said output using said measurement signal.

3. Method according to claim 1 wherein the active compensation is supplemented by a corresponding passive compensation impedance inserted in said signal processing system.

4. A device for compensating disturbance signals produced in a signal processing system from a leakage impedance in a signal path of said processing system through which an input signal flows, comprising:

a signal generator for supplying a measurement signal to said signal processing system superimposed on said input signal, said measurement signal having a frequency which differs from frequencies of signals which were produced by said processing system;

a measurement means connected to said processing system for comparing a measurement signal component which has been subject to said leakage impedances with said measurement signal whereby a value of said leakage impedance may be ascertained; and circuit compensation means for adding a compensating impedance to said path having a value for compensating said ascertained value of leakage impedance.

5. The device according to claim 4 wherein said measurement means includes a synchronous detector which provides an output signal representing the phase and amplitude of a measurement signal which has been subject to said leakage impedance.

6. The device according to claim 4 wherein said circuit compensation means adjusts the signal gain of said path which includes said leakage impedance.

7. The device according to claim 6 wherein said circuit compensation means also adjusts the phase of said path.

8. The device according to claim 4 wherein said circuit compensation means provides a signal path in parallel with said path including said leakage impedance.

9. The device according to claim 4 wherein said circuit compensation means compensates for dielectric capacitances in a piezo electric crystal in said signal processing system.

10. The device according to claim 4 wherein said compensation means compensates for stray capacitance of a vibrating solid state gyro.

* * * * *

UNITED STATES PATENT AND TRADEMARK OFFICE
CERTIFICATE OF CORRECTION

PATENT NO. : 5,896,033
DATED : April 20, 1999
INVENTOR(S) : Jan Söderkvist

It is certified that error appears in the above-indentified patent and that said Letters Patent is hereby corrected as shown below:

Column 10,
    Line 11, change "measuring" to --measurement--; and

Column 10,
    Line 13, change "measuring" to --measurement--.

Signed and Sealed this

Twenty-sixth Day of October, 1999

Attest:

Q. TODD DICKINSON

Attesting Officer     Acting Commissioner of Patents and Trademarks